United States Patent [19]
Flaker et al.

[11] Patent Number: 5,604,518
[45] Date of Patent: Feb. 18, 1997

[54] MEMORY STRUCTURE WITH MULTIPLE INTEGRATED MEMORY ARRAY PORTIONS

[75] Inventors: Roy C. Flaker; Gregory J. Schroer, both of Essex Junction; Roderick M. P. West, Colchester; Todd Williams, Burlington, all of Vt.

[73] Assignee: International Business Machines Corporation, Armonk, N.Y.

[21] Appl. No.: 220,090

[22] Filed: Mar. 30, 1994

[51] Int. Cl.$^6$ ........................................... G09G 5/06
[52] U.S. Cl. ........................................... 345/199
[58] Field of Search ........................... 345/199, 145

[56] References Cited

U.S. PATENT DOCUMENTS

| | | | |
|---|---|---|---|
| 4,769,632 | 9/1988 | Work et al. | 345/199 |
| 5,228,120 | 7/1993 | Farr et al. | 395/131 |
| 5,446,482 | 8/1995 | Van Aken et al. | 345/199 |
| 5,488,393 | 1/1996 | Wood et al. | 345/199 |

*Primary Examiner*—Jeffery Brier
*Attorney, Agent, or Firm*—Heslin & Rothenberg, P.C.

[57] ABSTRACT

An integrated memory structure, and associated processing method, is coupled to receive address data and control data. The memory structure includes a composite memory array having a first array portion and a second array portion which are separately addressable. The first array portion is accessed using at least some of the address data as a first address signal and the second array portion is addressed using at least some of the control data also as a second address signal. The memory structure is presented herein by way of example for a serial palette digital-to-analog (SPD) device, and incorporates indirect color mode, direct color mode, overlay color mode and cursor color mode processing in a single macro. When in direct color mode, access to the memory array is disabled and address data is transferred directly to an output of the memory structure as data out.

33 Claims, 11 Drawing Sheets

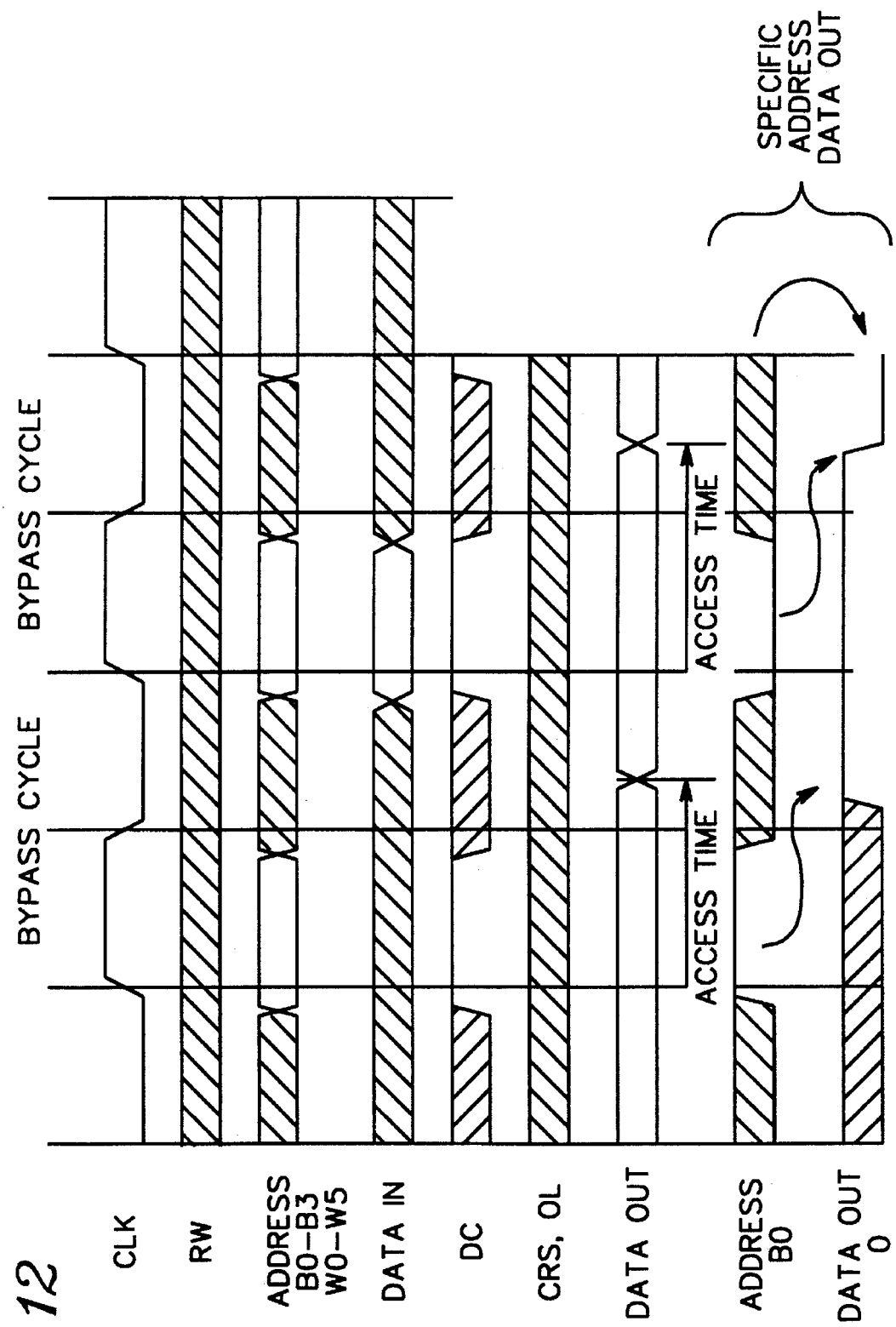

MEMORY STRUCTURE WITH MULTIPLE INTEGRATED MEMORY ARRAY PORTIONS

TECHNICAL FIELD

This invention relates in general to memory structures/systems, for example, for a graphics display system, and in particular, to an enhanced memory architecture having multiple memory array portions integrated together into a composite memory array. Use of the enhanced memory architecture in a serializer palette digital-to-analog conversion (DAC) device operable at high clock frequency is presented by way of example.

BACKGROUND ART

The most common display mode used in display systems, such as personal computers or display adapters for such computers, comprises the "indirect color mode." In this operational mode, picture element (or pixel) data contained in a display memory array is accessed to define the primary color intensity values of pixels to be displayed.

In a display system having an all-points addressable (APA) display memory, multiple bits are stored for each pixel of a display field corresponding, for example, to the screen of a display device. When operating in indirect color mode, these bits in the display memory form an index for accessing a location within a look-up table called a palette. The addressable locations in the palette contain display data defining the primary color intensity of a pixel having an index addressing that pixel palette location.

In the case of a display system controlling a color cathode ray tube (CRT), or other display device where colors are generated by mixing the primary colors red, green and blue, the pixel palette entry will contain intensity values for each primary color. If the display device requires analog signals for controlling the physical display processes, the intensity data output from the pixel palette are converted into analog signals by digital-to-analog converters (DACs) for controlling the display device, e.g., in the case of a color CRT, the color guns.

In indirect color mode, it is usual for up to eight bits to be stored for each pixel in a display memory and for these bits to be translated in a look-up table, or pixel palette, into three values which define the intensity of the red, green and blue components of the pixel. Today's standard indirect color mode is for the palette to generate eight bits each for red, green and blue, making 24 bits in all. Where the display memory comprises eight bit planes (i.e., 8 bits-per-pixel), it allows the simultaneous display of up to 256 different colors chosen from 16.8 million possible colors.

In certain other applications, referred to as "direct color mode," a pixel color may be specified directly. Conventionally, in this mode the values stored in the display memory control the display device directly via the DACs. Today's systems typically operate in either an indirect color mode, via pixel palettes, or a direct color mode, via a palette bypass. Additionally, SPD devices often support an overlay palette and a cursor palette for implementing an "overlay color mode" and a "cursor color mode," respectively. Thus, the ultimate display data fed to the DACs comprises 24 pixel data bits, consisting of eight bits for each primary color coming from four potential data sources, i.e., the pixel palettes, palette bypass, overlay palette and cursor palette. A major problem encountered when designing an SPD device is thus the complexity of the multiple display data paths that converge on a final multiplexer en route to the DACs. The problem is greatly magnified because the circuitry involved is typically running at pixel frequencies, e.g., frequencies in excess of 200 MHz, resulting in significant design challenges.

Between any two consecutive latch stages, logic and data flow functions cannot have large path delays because of the very short clock periods involved. This implies that complex logic or data flow operations must be spread over several latched stages in a "pipeline." Since all display data and data flow control must arrive synchronized to correctly generate the required display data, all paths must be the same length and therefore simple paths must be "padded" to match the length of the longest, most complex path. This results in significantly increased cell-counts, with even greater penalties incurred at higher pixel frequencies.

Large cell counts operated at very short clock periods significantly challenges the physical design and layout of the circuit's critical nets. To meet stringent, imposed timing criteria, a major effort must be expended in placement, floor planning and custom wiring stages of the design effort. Further, to ensure success, additional analysis and design interaction is often required, resulting in added design time and increased cell-count.

The present invention addresses these problems by providing an enhanced, memory structure having multiple, distinct memory array portions integrated together in a single macro which, for example, can be designed for an SPD device to accommodate indirect color mode, direct color mode, overlay color mode and cursor color mode processings to significantly improve data path timings and provide a cleaner logic interface compared with standard SPD device implementations.

DISCLOSURE OF INVENTION

Briefly summarized, the invention provides in a principal aspect a memory structure/system/chip which includes a memory array having a first memory array portion and a second memory array portion integrated together. The first memory array portion and the second memory array portion are separately addressable. First access means is provided for addressing the first memory array portion using received address data, and second access means is provided for accessing the second memory array portion using received control data as an address signal to the second memory array portion. Preferably, the first memory array portion and the second memory array portion are accessed through separate word lines, but share common bit lines in the memory array.

In another aspect, the invention comprises an integrated, random access memory structure coupled to receive address data and associated control data including a first control signal. The random access memory structure includes a memory array and access means for write and read accessing of the memory array using the address data. Disabling means are provided for disabling write and read accessing of the memory array by the access means in response to the first control signal of the control data. Further, bypass means, also responsive to the first control signal, directly transfers at least some of the address data to an output of the memory structure as data out. In a specific embodiment, the integrated random access memory can be combined with the above-outlined composite memory array and accessing means therefore.

An integrated memory structure for a serial palette digital-to-analog (SPD) device, is also presented. Again, the integrated memory structure receives address data and associated control data. The structure includes a memory array having a first memory array portion and a second memory array portion which are separately addressable. A first access means accesses the first memory array portion using address data as a first address signal and a second access means accesses the second memory array portion using at least some of the control data also as a second address signal. A bypass means is responsive to a first control signal within the control data for transferring at least some of the received address directly to an output of the integrated memory structure as data out.

In still another aspect, a method is presented for accessing an integrated memory structure having a composite memory array consisting of a first array portion and a second array portion which are separately addressable. The memory structure receives address data and associated control data. The method includes the steps of: accessing the first array portion using at least some of the address data as a first address signal to the first array portion; and accessing the second array portion using at least some of the control data also as a second address signal to the second array portion. Further details of the processing technique are described in detail herein.

To restate, the present invention comprises an enhanced memory structure/system/chip having multiple memory array portions integrated together in a single, composite array accessed through a single logic interface. In one embodiment, the memory architecture can accommodate indirect color mode, direct color mode, overlay color mode and cursor color mode processings in a single macro for use in an SPD device. The enhanced memory architecture significantly reduces the silicon area required to execute complex functions, such as those associated with the normal color, bypass, overlay and cursor functions of an SPD device. Further, the novel memory structure provides a clean logic interface, and eliminates certain critical data path timing and other problems encountered in certain physical circuit designs, such as those employed by existing SPD device implementations.

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIG. 3 is a block diagram of the relationship between FIGS. 3a & 3b.

FIG. 12 is a timing diagram of "direct color access mode" processing through the memory circuit embodiment of FIGS. 3a & 3b.

BEST MODE FOR CARRYING OUT THE INVENTION

The various aspects of the present invention are described below with reference to a graphics display system, and in particular, to a serializer palette DAC (SPD) device for such a system. However, those skilled in the art will recognize that the integrated memory structure/system/chip concepts presented herein can be readily configured for other uses. Thus, the claims presented herewith encompass more than the specific graphics memory embodiment described.

Figure 1:
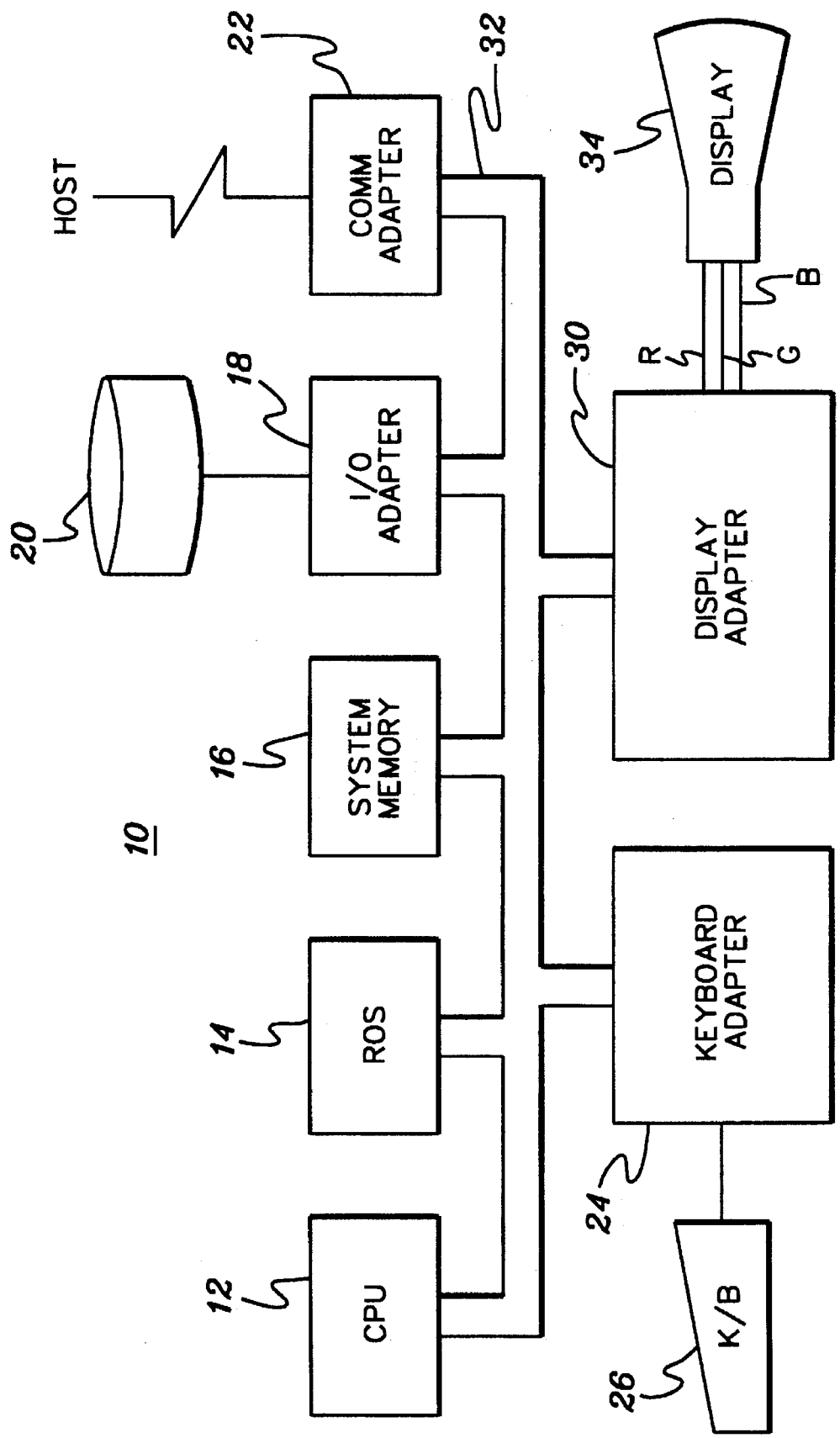
FIG. 1 is a block diagram of a graphics workstation within which a memory structure in accordance with the present invention may be incorporated.

FIG. 1 depicts a workstation, generally denoted 10, having a display adapter into which one or more memories architected in accordance with the present invention may be incorporated. Workstation 10 includes a central processing unit (CPU) 12 in the form of a conventional microprocessor and a number of other units, including a display adapter 30 connected thereto via a system bus 32. Also connected to the system bus are a random access memory (RAM) 16 and a read only store (ROS) 14. An I/O adapter 18 is provided for coupling the system bus to peripheral devices 20, such as disk units. Similarly, a communications adapter 22 is provided for connecting workstation 10 to external processors (e.g., a host computer). A keyboard 26 is connected to the system bus by a keyboard adapter 24.

The display adapter 30 is used for controlling the display of data on a display device 34. In operation, the CPU issues commands to the display adapter over the system bus causing it to perform display processing tasks. Display adapter 30 produces red, green and blue color signals R, G and B to drive the display device, herein a color cathode ray tube (CRT) 34. It should be appreciated that for other types of devices, other data formats could be generated. For example, if the display device is an LCD (Liquid Crystal Display), digital signals for red, green and blue might be generated.

Figure 2:
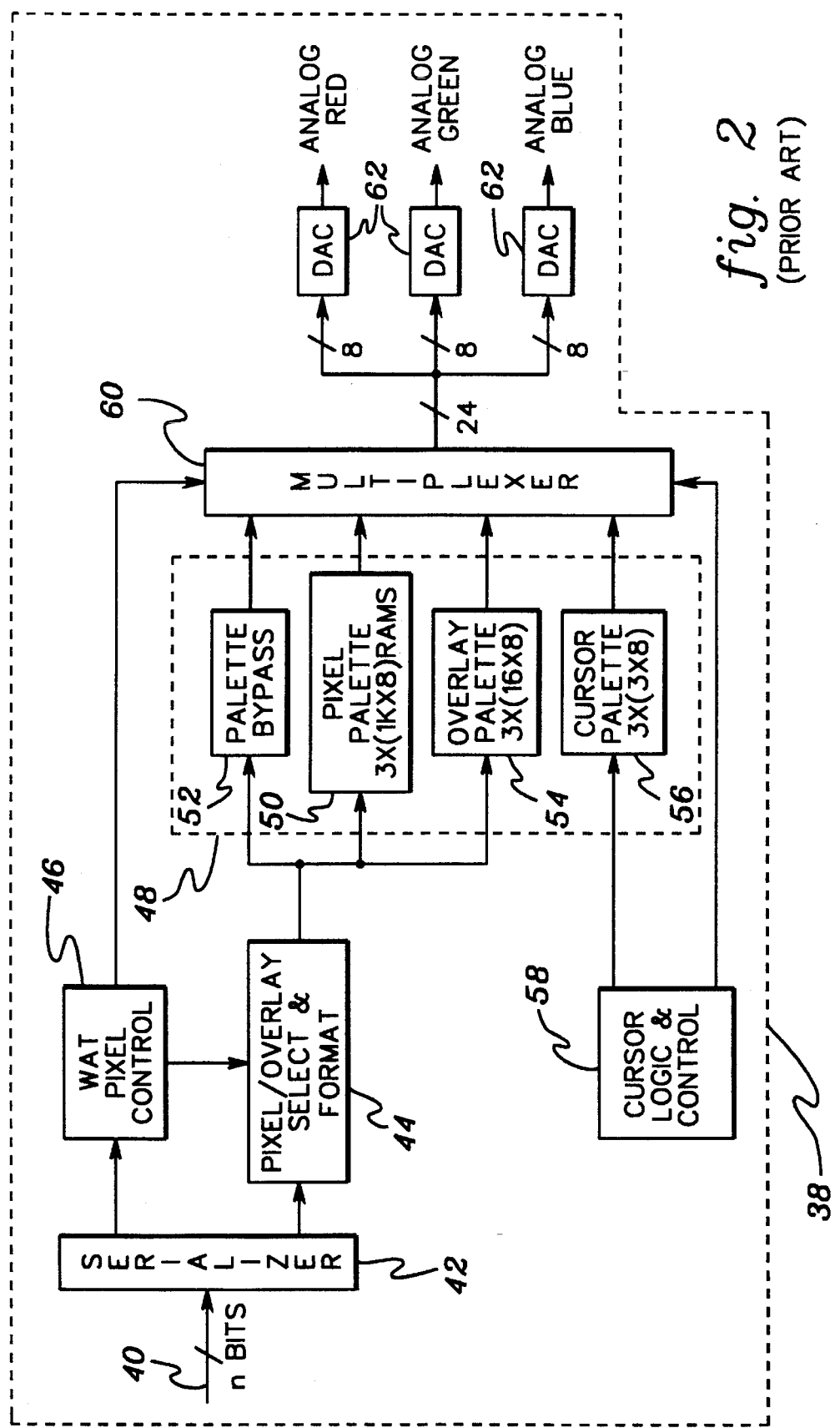
FIG. 2 is a block diagram representation of a conventional approach to implementing an SPD device for the display adapter of FIG. 1.

Display adapter 30 includes a serializer palette DAC (SPD) device, a conventional embodiment of which is presented in FIG. 2. This figure illustrates the major functional components of an SPD device employed in a typical workstation RAMDAC. Device 38 has three 8-bit digital-to-analog converters (DACs) 62 and handles variable pixel data formats of up to 24 bits-per-pixel and overlay data at four bits-per-pixel. Device 38 is shown with three 1024-entry pixel palette RAMs 50. The device also supports an on-board hardware cursor palette 56 and a cursor logic and control circuit 58, which together define cursor resolution to two bits-per-pixel. Again, this particular structure is illustrated for purposes of example only.

Multiple serial data bits are input in parallel on lines 40 to a serializer 42 from, for example, the serial output ports of multiple VRAM devices comprising the frame buffer (not shown) of the graphics subsystem. This serial data generally contains address and control data for multiple display pixels. Serializer 42 converts the n pixel data into a single pixel data stream at the display monitor's frequency. Within the pixel control data are three distinct control fields; namely, the "pixel window identifier (WID)," the "primary pixel data" and the "pixel overlay data."

The WID control field is used to access a window attribute table (WAT) within SPD device 38. The value thus obtained from the WAT is the "window attribute" associated with that pixel. The window attribute of a pixel determines a number of properties of the pixel, including: data format of "primary pixel data;" how primary pixel data is mapped to a palette RAM address; whether primary pixel data should bypass the palette RAMs, i.e., in a direct color mode; and whether "overlay data" should be displayed in place of primary pixel data.

Subject to the properties of the window attribute, the primary pixel data is processed and fed to three pixel palette RAMs 50, or the palette bypass circuitry 52, and pixel overlay data is fed to overlay palette 54. The display data fed to the DACs, consisting of 24 pixel data bits comprising eight bits for each primary color, comes from one of four potential data sources; i.e., either pixel palettes 50, palette bypass 52, overlay palette 54 or cursor palette 56.

The selection of data from one of these four sources is controlled by WAT pixel control 46 and cursor logic and control circuitry 58. Control signals from these two control circuits are pipelined through an appropriate number of latch stages (not shown) so that all data and control information arrive at a final multiplexer 60 synchronized to correctly select the required display data. Again, this portion of the SPD device, i.e., circuitry downstream from serializer 42 consists of high speed data paths operating at pixel speeds, for example, speeds in excess of 200 MHz. The selected 24 bit display data at the output of multiplexer 60 is presented to the inputs of DACs 62 for conversion into analog outputs corresponding to the three primary colors to drive the CRT monitor 34 (FIG. 1) and produce the desired, colored pixel display.

In addition to the pixel data obtained from the serializer, display data associated with hardware cursor 58 is also stored within the SPD device, e.g., in cursor palette 56. Also, display of the hardware cursor is controlled by the SPD device. The data for the hardware cursor is generally stored at a precision of two bits-per-pixel, which represents presence or absence of the cursor. The internally generated hardware cursor data addresses three entry cursor palettes 56, which have a data width of eight bits for each primary color. Because of the small number of entries, cursor palette 56 typically consists of three 24-bit registers and a 3:1 multiplexer to select one of the three entries.

The SPD device's color palette data look-up path shown in FIG. 2 handles all three primary display colors (red, green, blue), with three pixel palette RAMs, one for each color at a resolution of eight bits. Each palette RAM is shown to have 1024 entries, allowing for up to four 256 entry sub-palettes. Pixel overlay data has a resolution of four bits, addressing a separate 16 entry overlay palette 54, which provides a data width of eight bits for each primary color. Again in view of the small number of entries, overlay palette 54 might consist of 16 24-bit registers and a 16:1 multiplexer structure to select one of the 16 registers. The palette bypass circuit 52 generally consists of multiple latch stages which balance with the clocked delays through the palette lookup path, i.e., pixel palette 50.

AS can be seen from FIG. 2, a significant problem with the conventional design is the complexity of the multiple display data paths that converge on multiplexer 60 en route to DACs 62. This complexity is greatly magnified by the operating frequencies involved, e.g., frequencies in excess of 200 MHz.

Figure 3A:
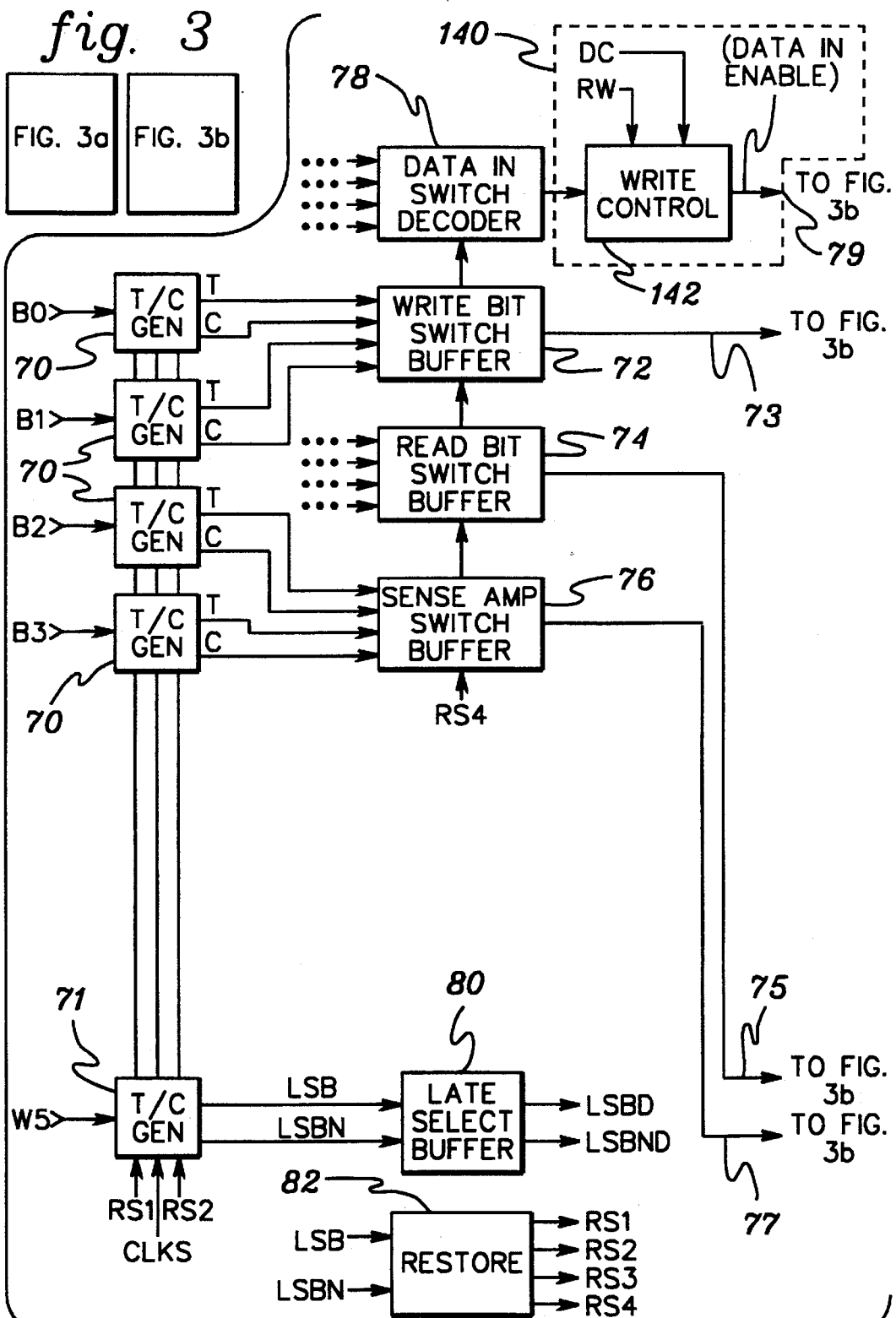
FIGS. 3a & 3b are a block diagram representation of one embodiment an integrated memory structure in accordance with the present invention.
Figure 3B:
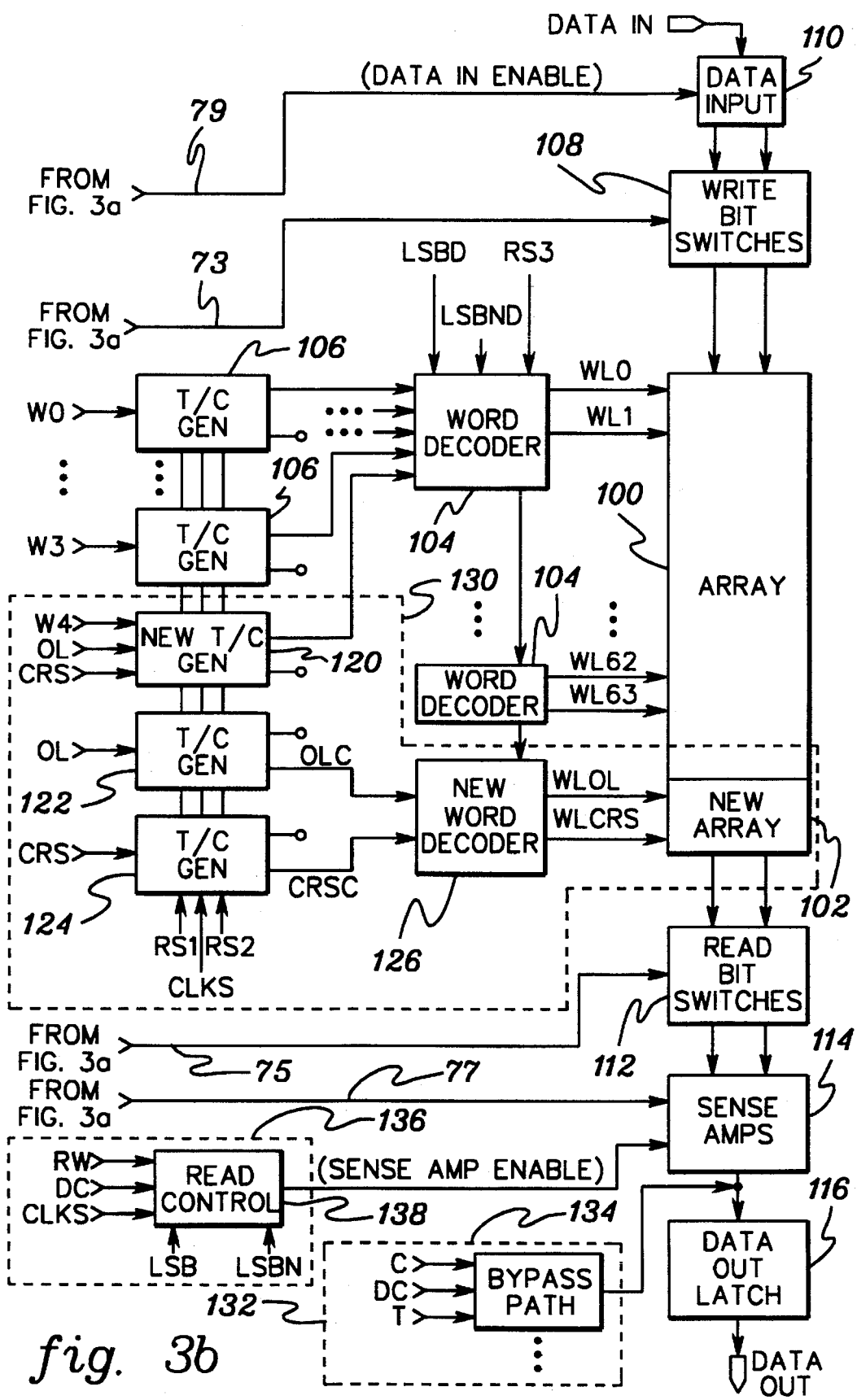

FIGS. 3a & 3b depict one embodiment of a memory structure in accordance with the present invention. This embodiment is specific to an SPD device. Architecture attributes assumed in the following discussion include synchronous random access memory (RAM) operation, return-to-zero addressing, tristated sense-amps, latched output data, NOR word line decoders, internal restore (not CLK driven) and edge-triggered clocking. Again, those skilled in the art will note that the concepts presented herein are readily adaptable to various different memory macros and, further, are not limited to the field of graphics display processing.

Generally stated, the memory structure of FIGS. 3a & 3b comprises a single integrated memory structure providing all of the functions normally performed by the conventional pixel palette 50, palette bypass 52, overlay palette 54, cursor palette 56 and multiplexer 60 of SPD device 38 of FIG. 2. Specifically, the integrated memory structure of FIGS. 3a & 3b includes circuitry for an indirect color mode, a direct color mode, an overlay color mode and a cursor color mode, all of which are implemented through the same logic interface without the necessity of data multiplexing.

A significant aspect of the enhanced memory structure is the provision for a single, composite memory array having separately addressable memory array portions. Beginning with FIG. 3b, a conventional, binary array portion 100 is shown having addressing on 64 word lines, i.e., WL0, WL1. . . , WL62, WL63. Although not shown, multiple bit line pairs are assumed to serve binary array portion 100, for example, 128 bit line pairs. In addition, a new array portion 102 is integrated with array portion 100 such that a composite memory array is formed with the two array portions sharing common bit line pairs. In the embodiment presented, new array portion 102 is addressed by two word lines, 'WLOL' and 'WLCRS.' As used herein the signal designation 'OL' refers to "overlay," while 'CRS' refers to "cursor." The resultant combination of array portion 100 and array portion 102 is a non-binary, composite memory array accessed by word lines WL0 through WL63 and WLOL and WLCRS. Access to the resultant non-binary memory structure is attained without requiring any additional address data than that required to access binary memory array portion 100. Specifically, pursuant to another aspect of the invention, control data is employed to generate the address signals 'WLOL' and 'WLCRS' needed to access new array portion 102. In addition, this control data, i.e., signals 'OL' and 'CRS,' is used in a conventional sense to logically deactivate accessing of binary memory array 100 whenever the control data indicates that the memory structure is in overlay mode or cursor mode.

Another novel aspect of the memory structure of FIGS. 3a & 3b is the inclusion of bypass function 132 to route address data directly to a data out latch 116 when the control data places the memory structure in a "bypass mode." Bypass mode is identified via an active direct color 'DC' control signal received from WAT pixel control 46 of FIG. 2. In addition to activating bypass path 134, control signal 'DC' simultaneously disables write bit switches 108 via write control circuit 140 and sense amps 114 via read control circuit 136. These structures and functions are described in greater detail below.

Referring to both FIGS. 3a & 3b, address data input to the enhanced memory structure includes bit address data B0, B1, B2 and B3 and word address data W0, W1, W2, W3, W4 and W5. The Bit address data is fed to true/complement generators 70, each of which outputs appropriate true 'T' and complement 'C' pulses whenever a clock input 'CLKS' goes active. True/complement generators 70 can comprise any conventional implementation. Reset to zero of T and C outputs occurs through restore signals 'RS1' and 'RS2,' discussed below. The true 'T' and complement 'C' outputs from those generators 70 receiving address bits B0 & B1 drive four write bit switch buffers 72, only one of which is shown, and four data in switch decoders 78, again only one of which is shown. Buffers 72 and decoders 78 comprise any conventional implementation. The outputs of write bit switch buffers 72 are fed, via line 73, to write bit switches 108 to either enable or disable the write switches. The outputs of data in switch decoders 78 are fed to a modified write control circuit function block 140 in accordance with the invention.

Figure 7:
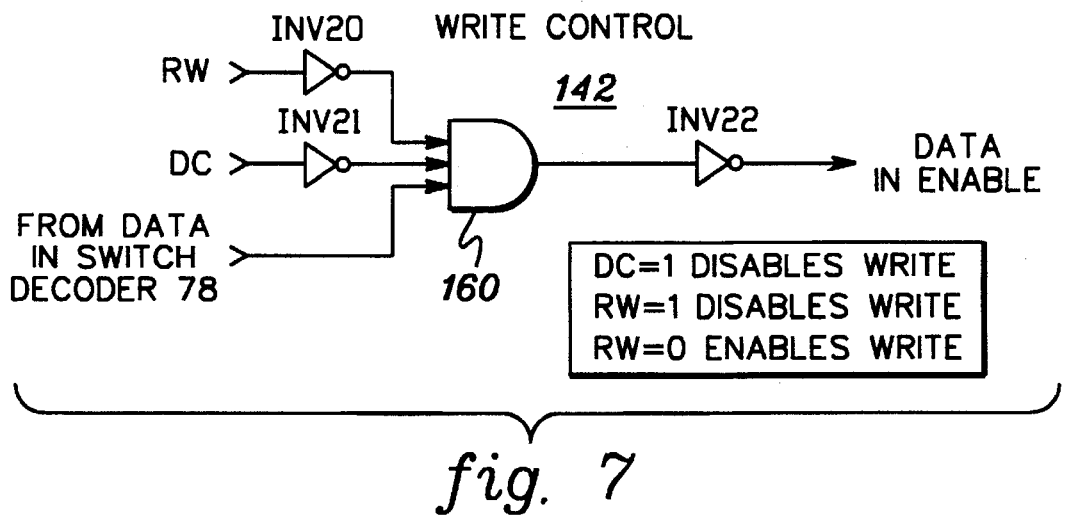
FIG. 7 is a schematic of one embodiment of a write control circuit in accordance with the present invention for the memory structure embodiment of FIGS. 3a & 3b.

Write control circuit 142 receives as input a standard read/write 'RW' control signal and the direct color 'DC' control signal. Output from write control 142 is a data in "enable" or "disable" signal. This signal is fed, via line 79, to data input 110, and enables/disables input of data to the memory structure. One embodiment of modified write control circuit 142 is presented in FIG. 7. As shown, a three input AND gate 160 logically combines the control signal inputs 'RW', 'DC' with the data from switch decoders 78. Signals 'RW' and 'DC' are first fed through inverters INV20 & INV21, respectively, before being combined at gate 160. The output of AND gate 160, fed through an inverter INV22, comprises the "data in enable" signal provided to data input 110.

Returning to FIGS. 3a & 3b, true 'T' and complement 'C' pulse outputs of generators 70 generated from address bits B2 and B3 are fed to four read bit switch buffers 74 and four sense amp switch buffers 76, again only one of which are shown. Buffers 74 output "enable" signals, via line 75, to read bit switches 112 connected to the bit line pairs of the integrated memory array. Output from buffers 76 is fed, via line 77, to sense amps 114, again to either activate or deactivate the appropriate sense amp switches. Self-timed restore of buffers 72, 74, 76 and decoders 78 occurs via restore signal RS4, generated as described below. Self-timed restore of the entire memory structure is preferably employed because of the high frequencies at which the structure operates.

Also input as address data are word line address signals W0, W1, W2, W3, W4 and W5. Address signal W5 is fed to a true/complement generator 71 to generate a true late select signal 'LSB' and a complement late select signal 'LSBN'. These signals are then buffered to produce delayed late select signals 'LSBD' and 'LSBND,' which are employed as part of the word line select to binary array portion 100, described below. Late select signals 'LSB' and 'LSBN' are also fed to a conventional restore circuit 82 for generation of restore signals RS1, RS2, RS3 and RS4. These restore signals are timed to actively reset the memory structure immediately after propagation of pulse signals through the structure corresponding to the received address and control data.

Figure 8:
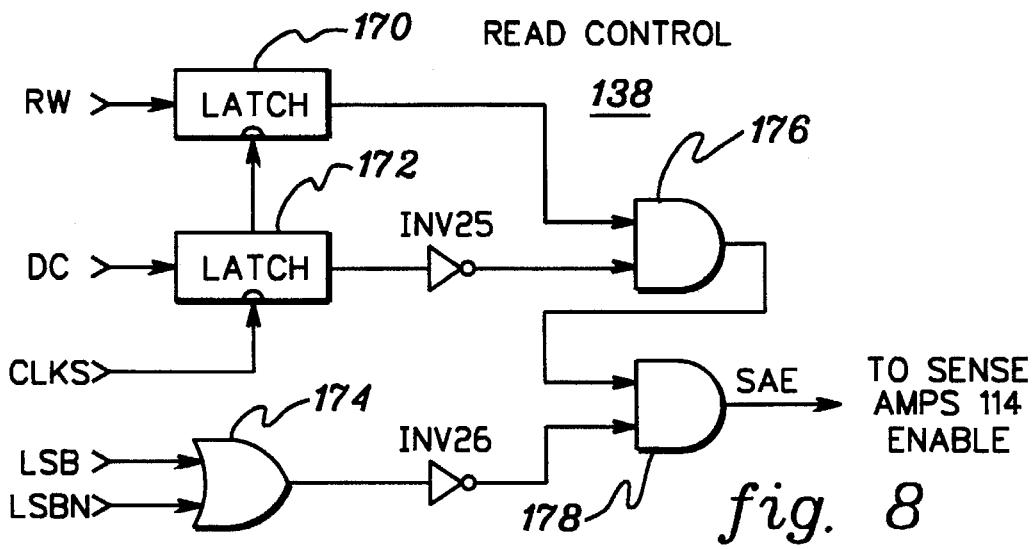
FIG. 8 is a schematic of one embodiment of a read control circuit in accordance with the present invention for the memory structure embodiment of FIGS. 3a & 3b.

Continuing with FIG. 3b, the structure includes a modified read control function block 136 which comprises a read control circuit 138 that receives as input the read/write signal 'RW', direct color 'DC' control signal, clock signals 'CLKS', late select signal 'LSB' and its complement 'LSBN.' One embodiment of a modified read control circuit 138 is presented in FIG. 8. As shown, the control signals 'RW' and 'DC' are fed to respective latches 170 & 172, which are clocked by signal CLKS. The output of latch 172 is inverted INV25 before being passed to a two input AND gate 176, while the output of latch 170 is fed directly to AND gate 176. The output of AND gate 176 is fed directly to two input AND gate 178. The second input of AND gate 178 is received from a NOR circuit comprising an OR gate 174 and inverter INV26. This circuit is coupled to receive the generated late select signals 'LSB' and 'LSBN.'

Conventional direct accessing of the binary memory array portion 100 of the integrated memory array is implemented by four true/complement generators 106 connected to receive address signals W0, W1, W2 and W3. As with true/complement generators 70 and 71, generators 106 are clocked by the clock signals 'CLKS' and restored by restore signals RS1 & RS2. The true output 'T' and the complement 'C' of each generator 106 is inputted to each of 32 word decoders 104. Also input to each word decoder 104 is the true output 'T' and the complement output 'C' from a "new true/complement generator" 120 pursuant to the present invention. Generator 120 is gated by address signal W4. However, this generator also receives control signals 'OL' and 'CRS.' Also, input to each word decoder 104 is restore signal 'RS3' and the buffered late select signals 'LSBD' and 'LSBND,' which are used to make a final word line selection to transition from a 1 of 32 fanout to a 1 of 64 fanout for addressing one of the 64 word lines in binary array portion 100.

Figure 4:
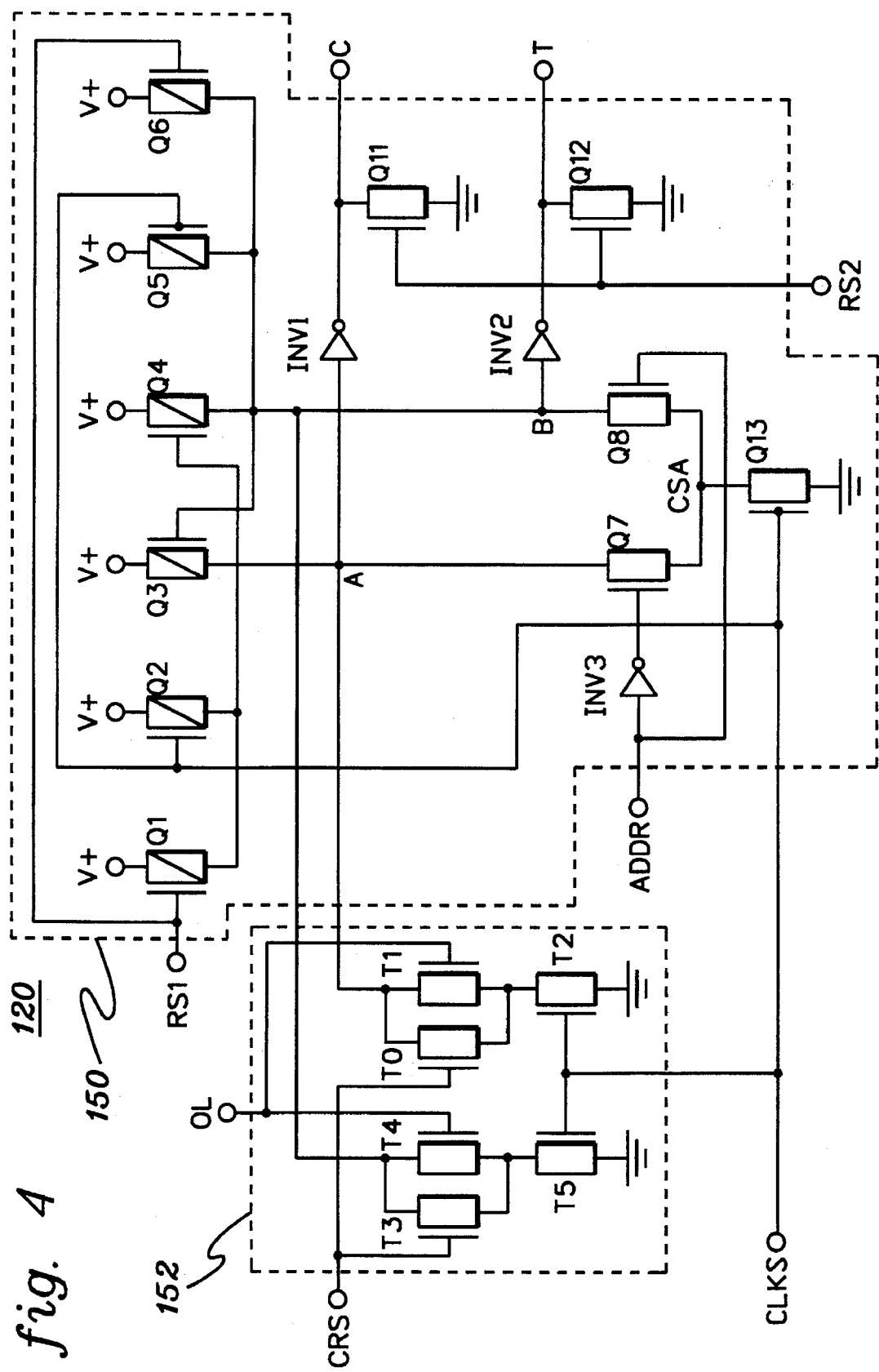
FIG. 4 is a schematic of one embodiment of a "new true-complement generator" in accordance with the present invention for the memory structure embodiment of FIGS. 3a & 3b.

One embodiment of new true/complement generator 120 is presented in FIG. 4. This figure consists of a standard true/complement generator portion 150 and a logical OR control circuit 152. The implementation shown includes complementary metal oxide semiconductor (CMOS) circuits with P-channel field-effect transistors (PFETs) indicated in the drawing by a rectangle with a diagonal line formed therein and a control element or gate electrode arranged adjacent thereto and with N-channel field-effect transistors (NFETs) indicated by a rectangle without a diagonal line and with a control element or gate electrode arranged adjacent thereto.

Conventional true/complement generator portion 150 includes a cascaded current switch comprising NFETs Q7, Q8 & Q13 and PFETs Q3 & Q4 connected as latches. PFETs Q1 & Q2 and Q5 & Q6 function as restore circuitry, as do NFET Q11 and NFET Q12, for actively returning the generator to zero state upon propagation of a pulse therethrough. The ADDR input is connected to receive word line signal W4. Circuit 152 logically ORs control signals 'OL' and 'CRS' in two parallel current switches T0, T1, T2 and T3, T4 and T5. As described further herein, when either the overlay control signal or the cursor control signal is 'active,' generator 120 outputs a signal which deactivates each word decoder 104 so that binary memory array portion 100 is not accessed.

Simultaneous with deactivating memory array 100, control signals 'OL' and 'CRS' are fed to two standard-type true/complement generators 122 and 124, respectively. Pursuant to the invention, selected control signals also function as address signals to access the new memory array portion 102. In this circuit, control data 'OL' and 'CRS' are decoded in new word decoder 126. Specifically, the complementary signals 'OLC' and 'CRSC' are received as input to decoder 126, which outputs word line signals 'WLOL' and 'WLCRS.'

Figure 5:
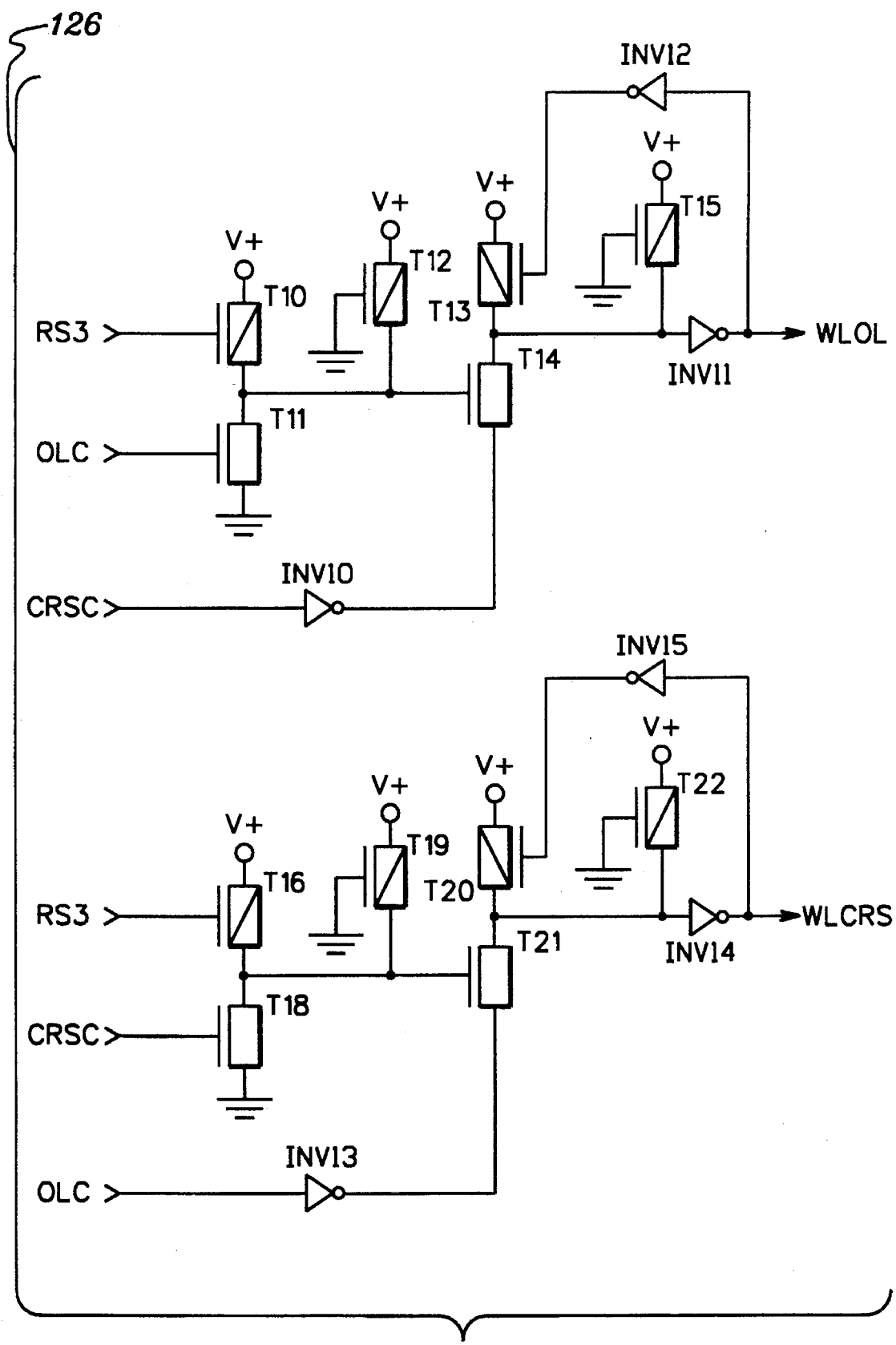
FIG. 5 is a schematic of one embodiment of an overlay/cursor word line decoder in accordance with the present invention for the memory structure embodiment of FIGS. 3a & 3b.

FIG. 5 presents one embodiment of an overlay/cursor word line decoder 126 pursuant to the invention. This decoder comprises two identical circuit portions wherein the complementary inputs 'OLC' and 'CRSC' from true/complement generators 122 and 124 are reversed. Decoder 126 is configured such that if the overlay signal is active high, then word line 'WLOL' is selected, while if the cursor signal is active high, then word line 'WLCRS' is selected. Provision of the two input signals to each circuit portion prevents both lines from being simultaneously selected. PFET T10 functions as a restore signal through RS3 and as part of a NOR decoder, which also comprises NFETs T11 and T14. PFETs T15 and T13, along with inverter INV12, comprise a restore circuit for the respective output node.

When in "direct color bypass mode," circuitry 134 is employed to pass selected address data, for example, address signals B0–B3 & W0–W3, directly to data out latch 116 as output of the memory structure. Bypass mode is initiated with receipt of an appropriate direct color 'DC' control signal, which is fed to multiple circuits 134 along with the true and complement address signals, 'T' and 'C,' from, for example, true/complement generators 70 and true/complement generators 106. In this embodiment, bypass circuit 134 would be replicated eight times, with the address true and address complement inputs for each bypass circuit being received from a different one of generators 70 and 106.

Figure 6:
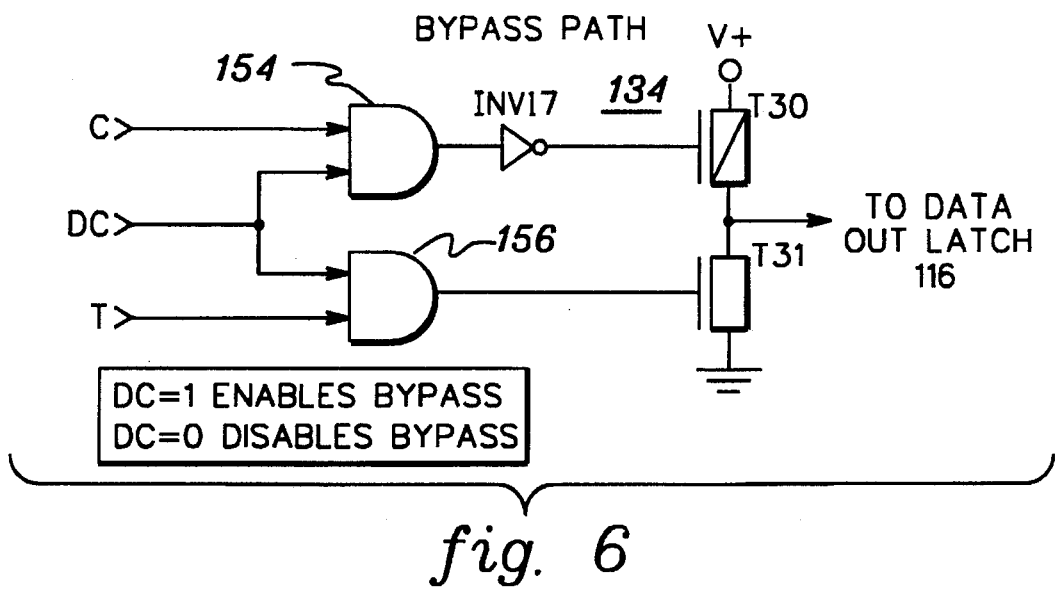
FIG. 6 is a schematic of one embodiment of a bypass path circuit in accordance with the present invention for the memory structure embodiment of FIGS. 3a & 3b.

FIG. 6 presents one embodiment of a bypass path circuit 134 in accordance with the invention. As shown, two input AND gates 154 & 156 receive the direct color 'DC' control signal and the respective true 'T' and complement 'C' address signals. The output of AND gate 154 is inverted, INV17 before gating an NFET T30, while the output of AND gate 156 directly gates a second NFET T31. The source of NFET T30 is commonly connected to the drain of NFET T31 at the output of the bypass circuit 134. When control signal 'DC' is active high, bypass is enabled, while a low 'DC' control signal disables the bypass circuit. When disabled, the bypass circuit is preferably tristated, as are the sense amps 114 (Fig. 3b). Thus, when one of memory array portions 100 & 102 is operative, the bypass path circuit 132 is tristated. Conversely, when the bypass path circuitry is operative, sense amps 114 would be tristated. When the direct color control signal is active, eight address signal pulses are passed directly through to data out latch 116.

Operation of the memory structure of FIGS. 3a & 3b can be summarized with reference to the timing diagrams of FIGS. 9–12. Further, Table 1 identifies the various timing modes, and the signals which place the memory structure therein.

TABLE 1

| DC | CRS | OL | RW | RAM Mode |
|---|---|---|---|---|
| 0 | 0 | 0 | 0 | Normal Palette - Write |
| 0 | 0 | 0 | 1 | Normal Palette - Read |
| 0 | 0 | 1 | 0 | OverLay - Write |
| 0 | 0 | 1 | 1 | OverLay - Read |
| 0 | 1 | 0 | 0 | Cursor - Write |

TABLE 1-continued

| DC | CRS | OL | RW | RAM Mode |
|---|---|---|---|---|
| 0 | 1 | 0 | 1 | Cursor - Read |
| 1 | 0 | 0 | X | Direct Color |
| 1 | 0 | 1 | X | Direct Color |
| 1 | 1 | 0 | X | Direct Color |

Wherein 'X' = "don't care."

Figure 9:
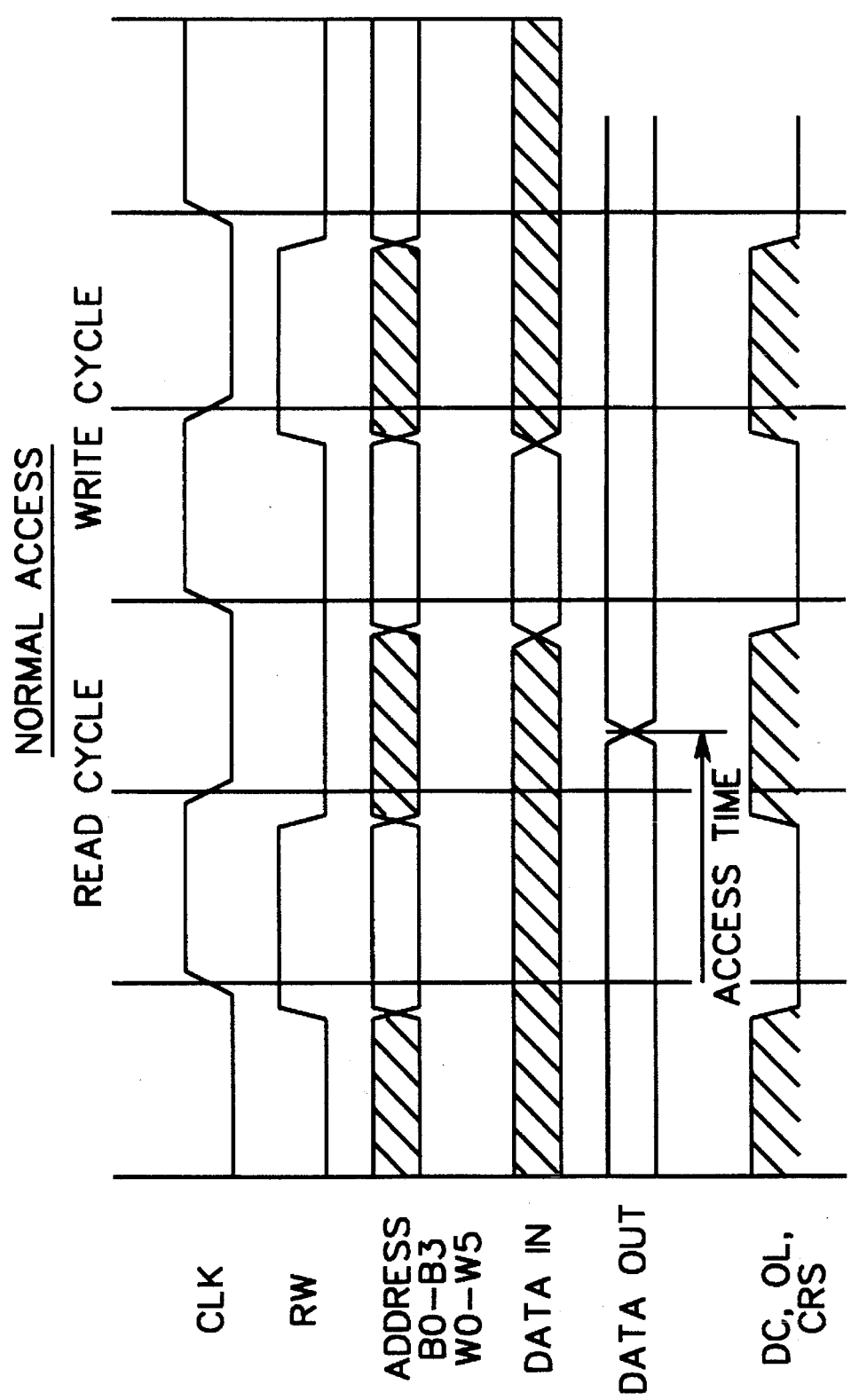
FIG. 9 is a timing diagram of "normal access mode" processing through the memory circuit embodiment of FIGS. 3a & 3b.

The timing diagrams of FIG. 9 represents a normal access mode wherein binary memory array portion 100 is accessed through one of the 64 word lines W0 through W63. In normal access, neither the write control circuit nor the read control circuit will be disabled by control signal 'DC.' However, the bypass path circuits are disabled by a '0' direct color 'DC' control signal. An overlay and cursor control signal equal to '0' disables both the overlay word line 'WLOL' and the cursor word line 'WLCRS.' Thus, selection of the new array portion 102 cannot occur. Further, new true/complement generator 120 (FIG. 3b) is not disabled, so that normal word line selection can occur.

Figure 10:
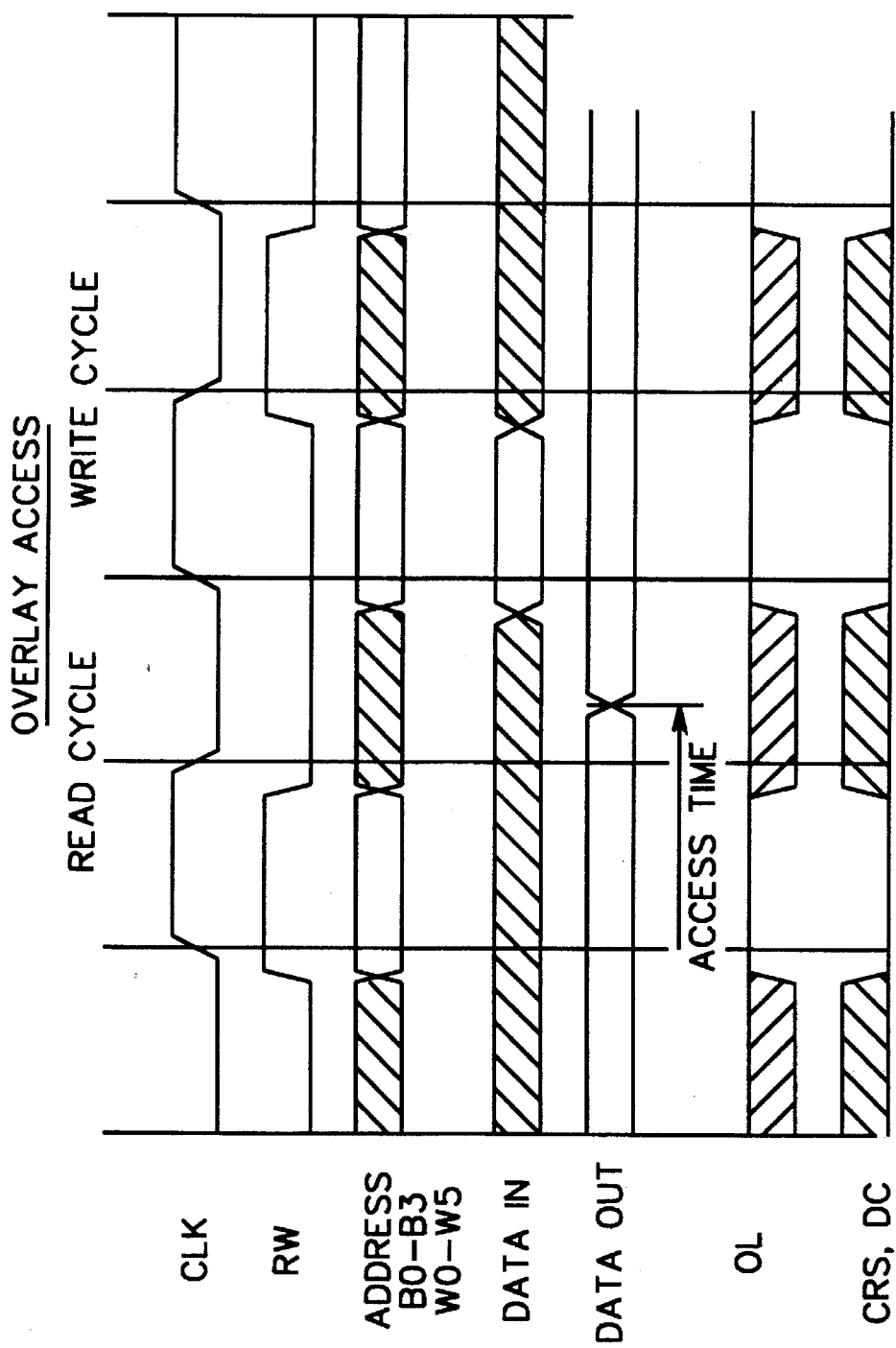
FIG. 10 is a timing diagram of "overlay access mode" processing through the memory circuit embodiment of FIGS. 3a & 3b.

Overlay color access, shown in FIG. 10, is identified by an active high overlay 'OL' control signal, and low cursor 'CRS' and direct color 'DC' control signals. When in overlay mode, the write control and read control circuits are not disabled by the direct control signal 'DC'; however, bypass circuitry is disabled by a low direct color signal. With the overlay control signal active high and the cursor control signal low, the word line 'WLOL' is selected by the new word decoder for initiation of overlay mode. An active high overlay 'OL' control signal being fed to the new true/complement generator 120 forces a disabling of all normal word decoders 104 so that no word line to binary memory array portion 100 can be selected.

Figure 11:
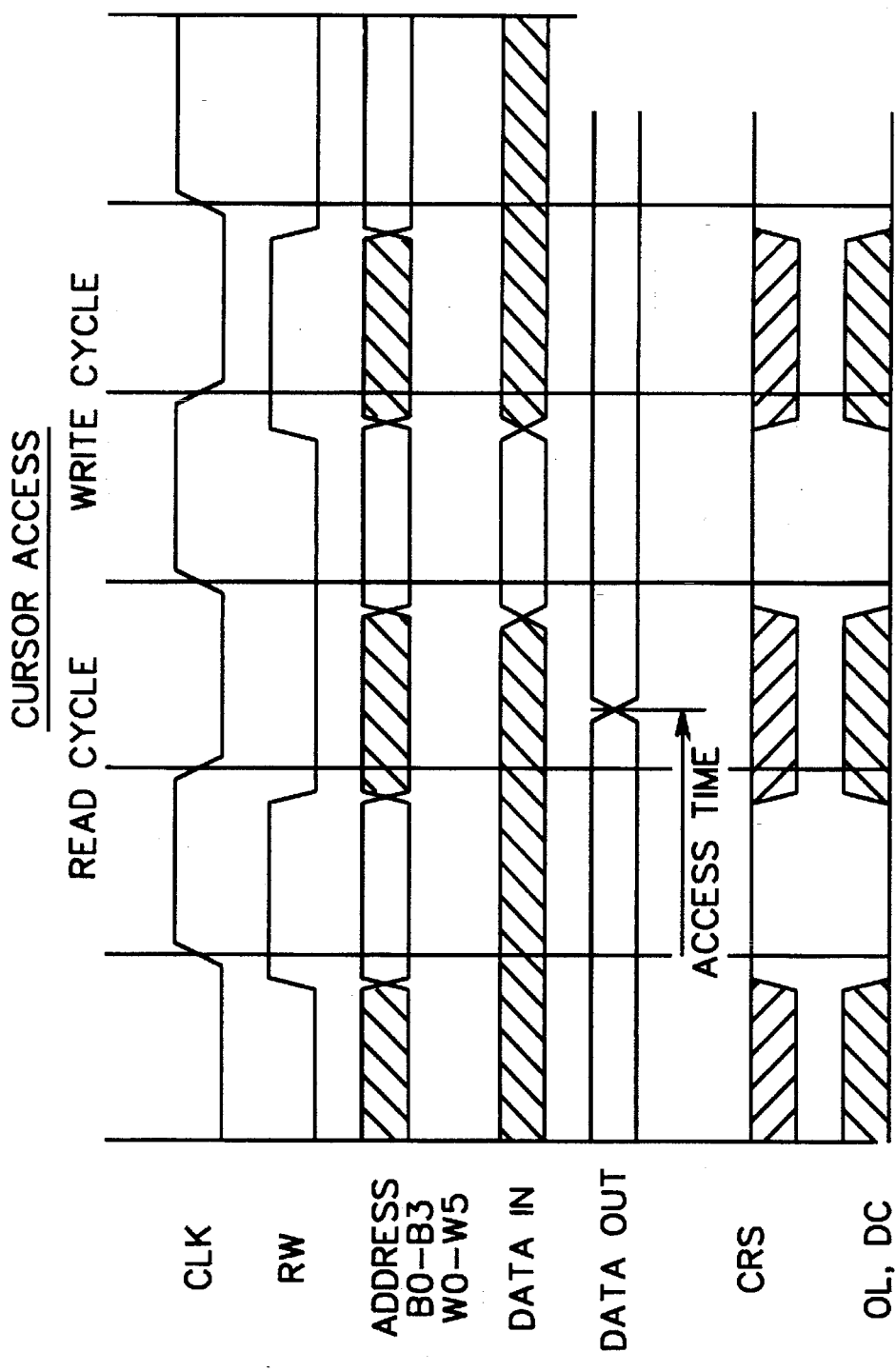
FIG. 11 is a timing diagram of "cursor access mode" processing through the memory circuit embodiment of FIGS. 3a & 3b.

FIG. 11 depicts a cursor access cycle, which occurs when the cursor 'CRS' control signal is active high, and the overlay 'OL' and direct color 'DC' control signals are low. When in cursor access mode, the write control circuit and read control circuit are again not disabled by the direct color 'DC' control signal, however, the bypass circuitry is disabled by the low 'DC' signal. With the overlay control signal 'OL' low and the cursor control signal 'CRS' high, the word line 'WLCRS' is selected by the new word decoder 126 (FIG. 3b). Further, a high cursor control signal 'CRS' fed to the new true/complement generator 120 disables normal word decoders 104 so that no word line to binary memory array portion 100 can be selected.

FIG. 12 depicts timing for a direct color access mode. The objective of this mode is to terminate all normal read/write memory operations in the array, while assuring proper restore and activation of the bypass path circuitry to pass data from the selected address inputs to the data outputs. To implement the mode, the following functions are provided: means to suspend or override all normal and special functions (overlay/cursor), and read and write operations utilizing the array whenever bypass mode is requested; means to allow proper restore of peripheral circuits, activated by CLK; means to activate the buffered, alternate data path attached to the true/complement address data bus path that connects the output of the existing tristated sense amps bus to the input of the output data latches; and means to disable the bypass mode when normal read/write operations or overlay/cursor modes through the array are desired.

Thus, a direct color 'DC' control signal 'DC' active high places the memory structure in bypass mode. The overlay 'OL,' cursor 'CRS' and read/write 'RW,' signals become "don't cares," with one exception. The exception being that both the overlay 'OL' control signal and the cursor 'CRS' control signal should not equal '1' in the same cycle. An active high 'DC' control signal disables the write control circuit and read control circuit, while simultaneously enabling the bypass path circuits, thus allowing the address data values, for example, on inputs B0–B3 and W0–W3, to propagate to the data out latches. Normal word and bit decode operations continue to properly reset the circuitry activated by the 'CLK' signal.

To restate, the present invention comprises an enhanced memory structure/system/chip having multiple memory array portions integrated into a single, composite memory array accessed through a single logic macro. In one embodiment, the memory architecture can accommodate indirect color mode, direct color mode, overlay color mode and cursor color mode processings in a single structure for use in an SPD device. The enhanced memory architecture significantly reduces the silicon area required to execute complex functions, such as those associated with normal color palette, bypass, overlay and cursor functions of an SPD device. Further, the novel architecture provides a clean logic interface, and eliminates certain critical data path timing and other problems encountered in certain physical circuit designs, such as those of existing SPD device implementations.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

We claim:

1. A memory structure coupled to receive an address signal and an associated control signal, said memory structure comprising:

a single memory array having a data input, a data output, a first memory array portion implementing a first function and a second memory array portion implementing a second function, said first function being different from said second function, said first memory array portion and said second memory array portion sharing said data input and said data output and being separately accessible within said single memory array using said address signal and said associated control signal;

first access means for accessing said first memory array portion using at least a portion of said address signal as a first address signal to the first memory array portion when said first function is desired; and second access means for accessing said second memory array portion using at least some of said control to qualify the address signal and thereby attain a second address signal to the second memory array portion when said second function is desired.

2. The memory structure of claim 1, wherein said first memory array portion and said second memory array portion share common bit lines in said single memory array.

3. The memory structure of claim 2, wherein said first memory array portion and said second memory array portion are separately addressed through a first set of word lines and a second set of word lines, respectively.

4. The memory structure of claim 1, wherein said first memory array portion comprises a binary array.

5. The memory structure of claim 4, wherein said single memory array comprises a non-binary array.

6. The memory structure of claim 1, further comprising means for disabling output from at least one of said first access means and said second access means using said control signal received by the memory structure.

7. The memory structure of claim 1, further comprising means for writing data to said single memory array and means for reading data from said single memory array, and means for providing at least one control bit of said control signal to said means for writing and to said means for reading, wherein said at least one bit of said control signal controls writing of data to and reading of data from said single memory array.

8. The memory structure of claim 1, wherein said memory structure comprises a semiconductor memory chip.

9. The memory-structure of claim 1, wherein said memory structure comprises a modified static random access memory (SRAM).

10. The memory structure of claim 1, further comprising means for transferring a received address signal to said data output of the single memory array as output data in response to a first control bit of said control signal, and further comprising means for disabling, in response to said first control bit, both said first access means and said second access means from accessing said single memory array.

11. The memory structure of claim 10, wherein said memory structure is designed for use in a serializer palette digital-to-analog conversion (SPD) device, and wherein said first control bit comprises a direct color 'DC' control bit.

12. The memory structure of claim 11, further comprising means for writing data to said single memory array, and further comprising means for reading data from said single memory array and means for providing said direct color 'DC' control bit to said means for writing and said means for reading to disable the writing of data to and reading of data from the single memory array.

13. The memory structure of claim 1, wherein said second memory array portion is separately addressed through multiple word lines and wherein said at least some of said control signal employed in forming said second address signal is received at a word line decoder means coupled to the multiple word lines of the second memory array portion.

14. The memory structure of claim 13, wherein the memory structure is designed for a serializer palette digital-to-analog conversion (SPD) device, said second memory array portion comprising an overlay palette and a cursor palette, and wherein said at least some of said control signal includes an overlay 'OL' control bit for controlling accessing of overlay data from said second memory array portion, and wherein said at least some of said control signal used in forming the second address signal includes a cursor 'CRS' control bit for accessing cursor data from said second memory array portion.

15. The memory structure of claim 14, further comprising means for disabling output from said first access means, said means for disabling output being coupled to receive said overlay 'OL' control bit and said cursor 'CRS' control bit, said means for disabling responding to an active overlay 'OL' control bit or an active cursor 'CRS' control bit by disabling output from said first access means.

16. The memory structure of claim 15, wherein said first memory array portion contains a color palette accessed by said address signal during a normal access mode of said memory structure.

17. An integrated, random access memory structure coupled to receive an address signal and an associated control signal, said associated control signal including a first control signal portion, said integrated, random access memory structure comprising:

- a random access memory array having a data input and a data output;
- access means for write and read accessing of said memory array using said address signal;
- disabling means, responsive to said first control signal portion, for disabling write and read accessing of said memory array by said access means; and
- bypass means, also responsive to said first control signal portion, for directly transferring at least some of the address signal to the data output of the memory array as data out.

18. The integrated, random access memory structure of claim 17, wherein said access means includes means for writing data to said memory array and means for reading data from said memory array, and wherein said disabling means includes means for disabling output from said means for writing data and output from said means for reading data in response to said first control signal portion.

19. The integrated, random access memory structure of claim 18, wherein said integrated, random access memory structure is designed for a serial palette digital-to-analog converter (SPD) device, and wherein said first control signal portion comprises a direct color 'DC' control signal.

20. The integrated, random access memory structure of claim 17, wherein said integrated, random access memory structure comprises a semiconductor memory chip.

21. The integrated, random access memory structure of claim 17, wherein said integrated, random access memory structure comprises a modified static random access memory (SRAM).

22. The integrated, random access memory structure of claim 17, wherein said memory array includes a first memory array portion and a second memory array portion, said first memory array portion and said second memory array portion being separately accessible using said address signal and said associated control signal, and wherein said access means includes a first access means for accessing said first memory array portion using said address signal as a first address signal to the first memory array portion, and second access means for accessing said second memory array portion using at least some of said control signal to qualify the address signal and thereby attain a second address signal to the second memory array portion.

23. The integrated, random access memory structure of claim 22, wherein said first memory array portion and said second memory array portion share common bit lines in said memory array, and wherein said first memory array portion comprises a binary array and said memory array comprises a non-binary array.

24. The integrated, random access memory structure of claim 22, wherein said first memory array portion and said second memory array portion are separately addressed through a first set of word lines and a second set of word lines, respectively.

25. An integrated memory structure for a serial palette digital-to-analog conversion (SPD) device, said integrated memory structure receiving an address signal and an associated control signal, said integrated memory structure comprising:

- a single memory array having a data input, a data output, a first memory array portion and a second memory array portion, said first memory array portion and said second memory array portion sharing said data input and said data output and being separately accessible within said single memory array using said address signal and said associated control signal;
- first access means for accessing said first memory array portion using at least a portion of said address signal as a first address signal to the first memory array portion;
- second access means for accessing said second memory array portion using at least some of said control signal to qualify the received address signal to attain a second address signal to the second memory array portion; and
- bypass means responsive to a first control signal portion of said control signal for transferring at least some portion of the received address signal directly to the data output of the memory array as data out of the integrated memory structure.

26. The integrated memory structure of claim 25, wherein said bypass means further includes disabling means responsive to said first control signal portion for disabling write and read accessing of said single memory array by said first access means and by said second access means.

27. The integrated memory structure of claim 26, wherein said first control signal portion comprises a direct color 'DC' control signal.

28. The integrated memory structure of claim 25, wherein said integrated memory structure comprises a modified static random access memory (SRAM).

29. The integrated memory structure of claim 25, wherein said first memory array portion and said second memory array portion share common bit lines in said single memory array, and wherein said first memory array portion comprises a binary array and said single memory array comprises a non-binary array.

30. The integrated memory structure of claim 25, wherein said first access means accesses said first memory array portion through a first set of word lines and said second access means accesses said second memory array portion through a second set of word lines.

31. A method for accessing an integrated memory structure having a composite memory array consisting of a first array portion supporting a first function and a second array portion supporting a second function, said integrated memory structure receiving an address signal and an associated control signal, said method comprising the steps of:

(a) accessing said first array portion using at least some of said address signal as a first address signal to the first array portion when said first function is desired; and (b) accessing said second array portion using at least some of said control signal to qualify the address signal and thereby attain a second address signal to the second array portion when the second function is desired.

32. The method of claim 31, further comprising the step of disabling at least one of said accessing of step (a) and said accessing of step (b) pursuant to said control signal.

33. The method of claim 31, further comprising the step of disabling both said accessing of step (a) and said accessing of step (b) pursuant to a first control signal portion of said control signal and directly transferring at least some of said address signal to an output of the composite memory array as data out of the integrated memory structure.

* * * * *